United States Patent
Khwa et al.

(10) Patent No.: US 9,312,029 B2
(45) Date of Patent: Apr. 12, 2016

(54) MEMORY DEVICE AND ASSOCIATED CONTROLLING METHOD

(71) Applicant: Macronix International Co., Ltd., Hsinchu (TW)

(72) Inventors: Win-San Khwa, Taipei (TW); Chao-I Wu, Hsinchu (TW); Tzu-Hsiang Su, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/309,920

(22) Filed: Jun. 20, 2014

(65) Prior Publication Data

US 2015/0255126 A1    Sep. 10, 2015

Related U.S. Application Data

(60) Provisional application No. 61/950,225, filed on Mar. 10, 2014.

(51) Int. Cl.
| | |
|---|---|
| *G11C 11/56* | (2006.01) |
| *G11C 29/12* | (2006.01) |
| *G11C 29/50* | (2006.01) |
| G11C 29/04 | (2006.01) |
| G11C 13/00 | (2006.01) |

(52) U.S. Cl.
CPC ............ *G11C 29/12* (2013.01); *G11C 11/5678* (2013.01); *G11C 13/004* (2013.01); *G11C 13/0035* (2013.01); *G11C 13/0069* (2013.01); *G11C 29/50008* (2013.01); *G11C 13/0004* (2013.01); *G11C 2013/0092* (2013.01); *G11C 2029/0409* (2013.01); *G11C 2211/563* (2013.01); *G11C 2211/5644* (2013.01); *G11C 2211/5646* (2013.01)

(58) Field of Classification Search
CPC .. G11C 11/56; G11C 11/565; G11C 13/0069; G11C 13/0004
USPC .......................................... 365/168, 148, 163
See application file for complete search history.

(56) References Cited

U.S. PATENT DOCUMENTS

| | | | |
|---|---|---|---|
| 8,139,392 B2 * | 3/2012 | Hosoi ..................... | H01L 45/04 365/100 |
| 2011/0235403 A1 * | 9/2011 | Kang ........................... | 365/148 |

* cited by examiner

*Primary Examiner* — Huan Hoang
(74) *Attorney, Agent, or Firm* — McClure, Qualey & Rodack, LLP

(57) ABSTRACT

A memory device and associated controlling method are provided. The memory device includes a memory cell array, a sensing unit and a controller. The memory cell array has a plurality of memory cells. The sensing unit is electrically connected to the memory cell array and the controller. The sensing unit senses characteristic of a memory cell of the plurality of memory cells. The controller determines whether the characteristic of the one of the memory cells deviates and accordingly controls the memory cell array.

20 Claims, 15 Drawing Sheets

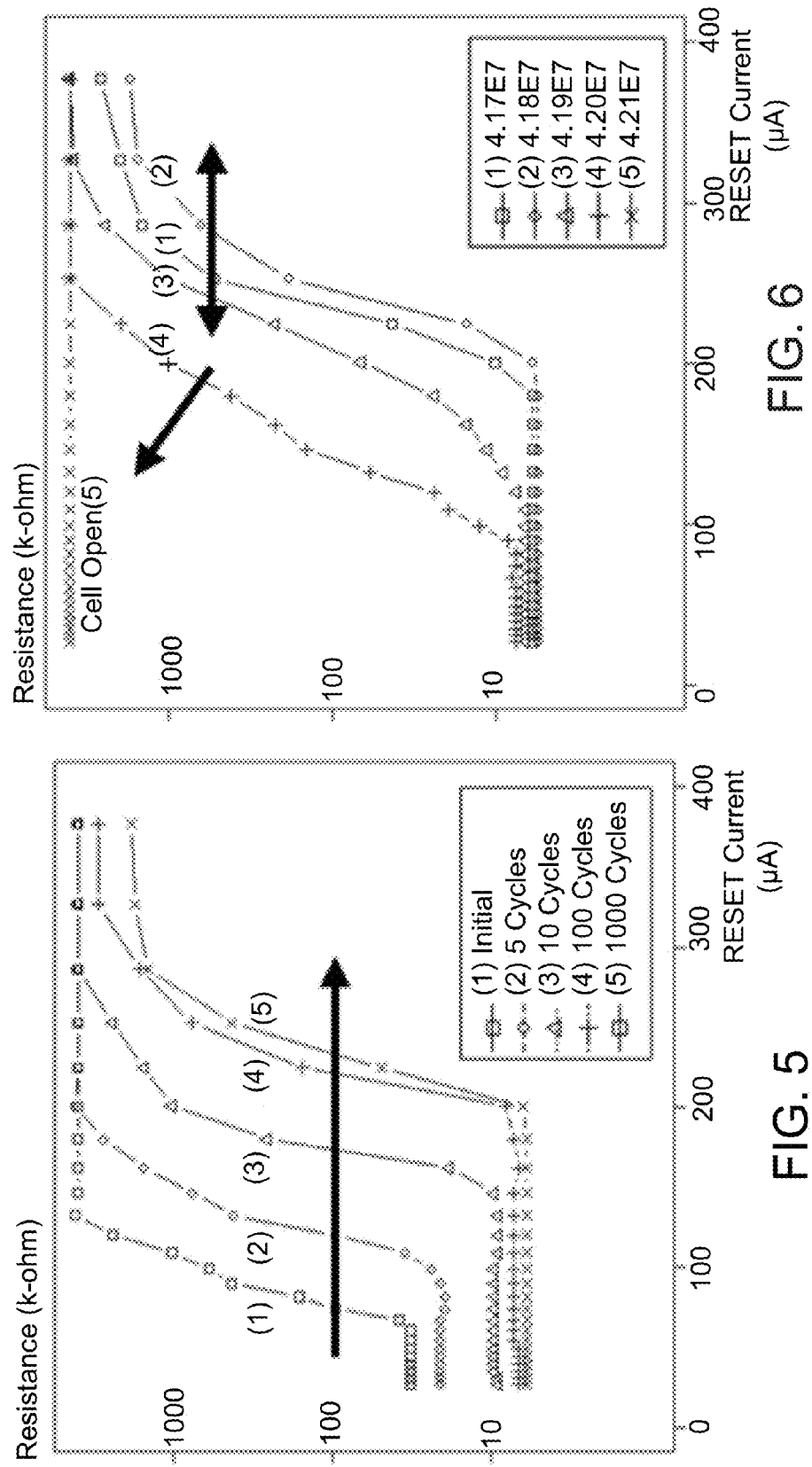

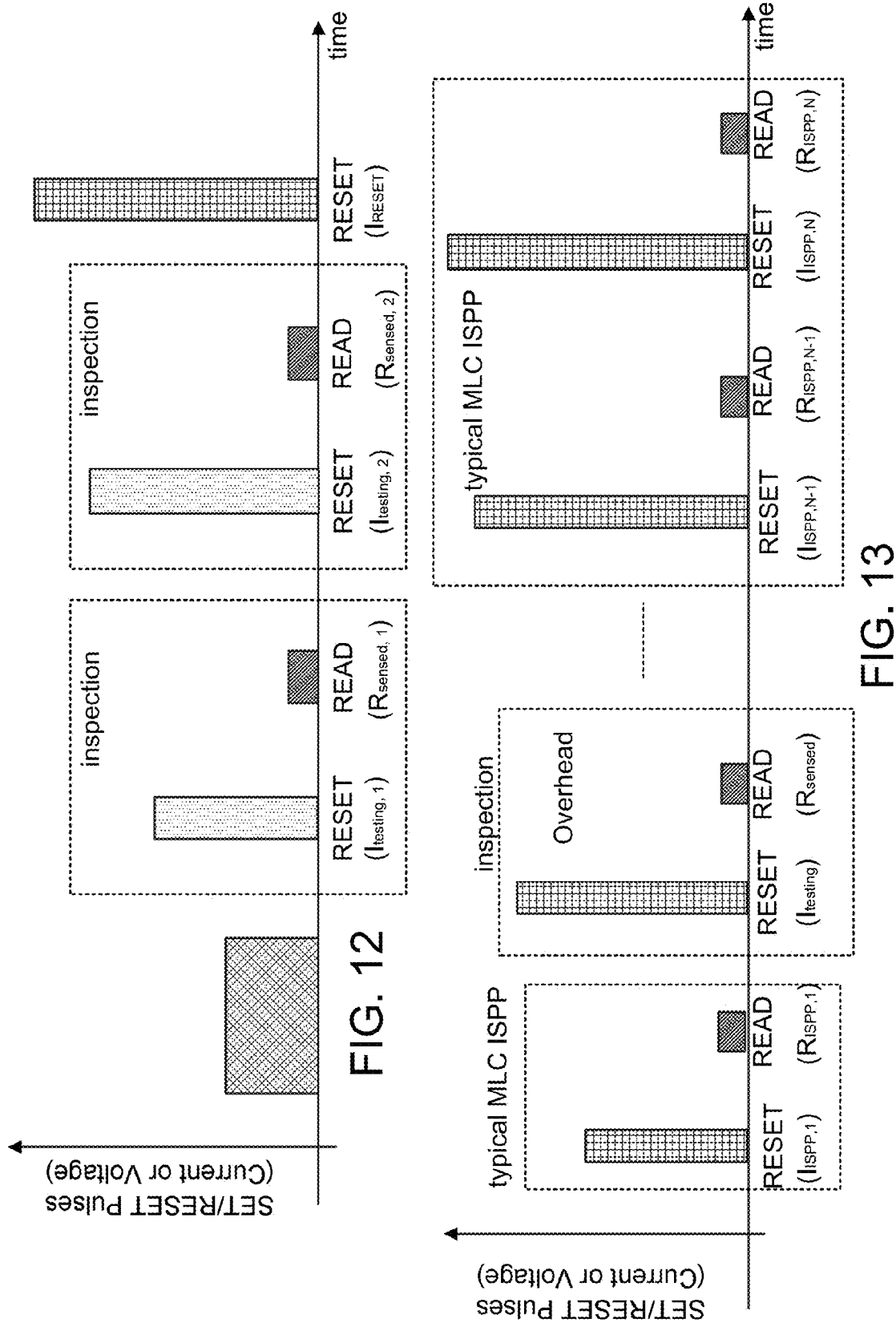

MEMORY DEVICE AND ASSOCIATED CONTROLLING METHOD

This application claims the benefit of U.S. provisional application Ser. No. 61/950,225, filed Mar. 10, 2014, the subject matter of which is incorporated herein by reference.

FIELD OF THE INVENTION

The present invention relates to a memory device and associated controlling method, and more particularly to a memory device and associated controlling method sensing characteristic of a memory cell.

BACKGROUND OF THE INVENTION

Non-volatile memories can retain stored data without applying power. Therefore, non-volatile memories have been increasingly used in a variety of host devices. With the development of technology, various non-volatile memory technologies such as NOR flash, NAND flash, resistive random-access memory (hereinafter, ReRAM) and phase change memory (hereinafter, PCM) etc. are proposed.

Blocks in non-volatile memories can tolerate a finite number of program/erase cycles before becoming unreliable. The repeated use of a limited number of blocks in the non-volatile memory can cause a memory device to prematurely wear out or exceed its program endurance. Thus, wear leveling, a process of managing access to non-volatile memory devices, is provided to equalize the use of memory blocks and extend life of the memory device.

In short, the wear leveling algorithms prolong usage of non-volatile memory devices by evenly distributing data in the non-volatile memory device. For each physical block, a practical programming cycle count is monitored and compared with a specific threshold of programming cycle count. Once the practical programming cycle count corresponding to a physical block is equivalent to the specific threshold of programming cycle count, the wear leveling algorithm will perform special operations on the physical block, such as prohibit block accessing. That is to say, selection of the specific threshold of programming cycle count seriously impacts utilization of memory blocks.

In FIGS. 1 and 2, allowable programming cycle counts (i.e. lifetime/endurance) of memory blocks a, b, c, d, and e are represented by the rectangles. The specific threshold of programming cycle count is shown by the dotted lines. The upper edges of the rectangles represent the allowable programming cycle counts of the memory blocks a, b, c, d, and e. A memory block corresponding to a longer rectangle has a longer lifetime, i.e. allowable programming cycle counts of the memory block is greater. When practical programming cycle count of a memory block reaches the specific threshold of programming cycle count as defined by the dotted lines, the wear leveling algorithm no longer programs the memory block.

FIG. 1 is a schematic diagram illustrating a conventional wear leveling algorithm with a conservative approach. According to FIG. 1, the specific threshold of programming cycle count is smaller. That is, position of the dotted line is relatively lower and the practical programming cycle counts of the memory blocks a, b, c, d, and e are less.

The screentone areas corresponding to the memory blocks a, b, c, d, and e, represent differences between their allowable programming cycle counts, and the specific threshold of programming cycle count determined by the wear leveling algorithm. Therefore, the screentone areas indicate part of the allowable programming cycle counts which are not actually utilized. In reality, the screentone areas represent waste of allowable programming cycle counts corresponding to the memory blocks a, b, c, d, and e.

FIG. 2 is a schematic diagram illustrating a conventional wear leveling algorithm with an aggressive approach. According to FIG. 2, the specific threshold of programming cycle count is greater. That is, position of the dotted line is relatively higher and the practical programming cycle counts of the memory blocks a, b, c, d, and e are greater. Compared with FIG. 1, only two screentone areas corresponding to the memory blocks b and c are shown in FIG. 2.

The double headed arrows indicate over-utilization of the memory blocks a, d, and e. That is, the wear leveling algorithm is not aware that the practical programming cycle counts of memory blocks a, d, and e are greater than the allowable programming cycle counts of the same. In such case, data stored in memory blocks a, d, and e might be erroneous. Some error correcting code (hereinafter, ECC) algorithms are applied to remedy such problems. However, correcting capability of ECC algorithms is not unlimited and calculation process of ECC algorithms brings overhead as well.

The conventional wear leveling algorithms are based on a questionable basis, that is, lifetime of different memory blocks are all assumed to be consistent. However, the allowable programming cycle counts of different memory blocks vary in practice. Consequently, determination of the specific threshold of programming cycle count becomes a dilemma.

When the specific threshold of programming cycle count is low, i.e. the wear leveling algorithm is conservative/strict, lifetime of the memory blocks will likely to be highly under estimated. That is to say, the memory device is not effectively utilized.

Alternately, when the specific threshold of programming cycle count is high, i.e. the wear leveling algorithm is aggressive/lenient, lifetime of the memory blocks will likely to be highly overestimated. Such over estimation of endurance of memory blocks implies risk of losing data.

In addition, the conventional wear leveling algorithms require an extra space to store the accumulated cycle counts corresponding to the memory blocks. As memory capacity increases and management unit becomes fine-grained, extra space required by the wear leveling algorithms should not be overlooked.

SUMMARY OF THE INVENTION

An embodiment of the present invention provides a memory device. The memory device includes a memory cell array, a sensing unit and a controller. The memory cell array has a plurality of memory cells. The sensing unit is electrically connected to the memory cell array and the controller. The sensing unit senses a characteristic of a memory cell among the plurality of memory cells. The controller determines whether the characteristic of the memory cell deviates and accordingly controls the memory cell array.

Another embodiment of the present invention provides a controlling method. The control method is applied to a memory cell array with a plurality of memory cells. The control method includes following steps. Firstly, a characteristic of a memory cell among the plurality of memory cells is sensed by a sensing unit. Then, a controller determines whether the characteristic of the memory cell deviates. The controller further controls the memory cell array in response to whether the characteristic of the memory cell deviates.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5 is a schematic diagram illustrating resistance versus current (R-I) curves for a healthy PCM cell in the RESET operation;

FIG. 6 is a schematic diagram illustrating resistance versus current curves for a dying PCM cell in the RESET operation;

FIG. 12 is a schematic diagram illustrating a programming method according to an embodiment of the present invention;

FIG. 13 is a schematic diagram illustrating testing pulse is merged to ISPP of a RESET operation;

DETAILED DESCRIPTION OF PREFERRED EMBODIMENTS

Figure 3:
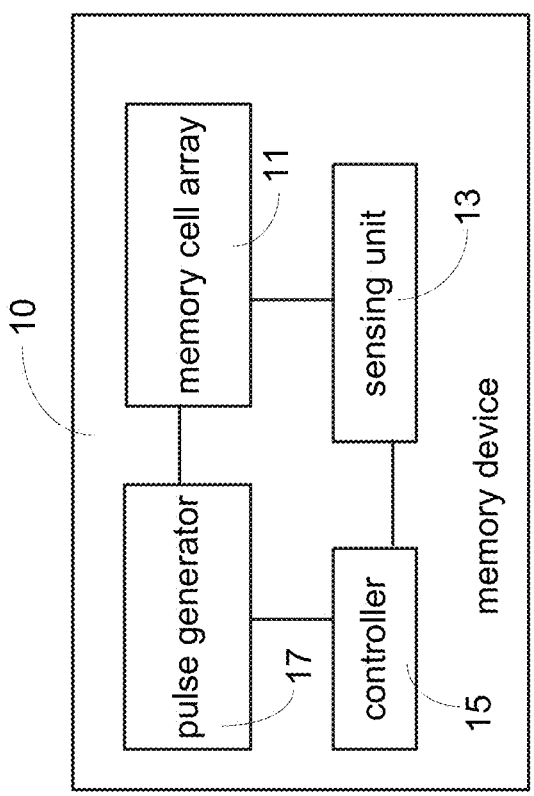
FIG. 3 is a block diagram of a memory device.

FIG. 3 is a block diagram of a memory device. The memory device 10 includes a memory cell array 11, a sensing unit 13, a pulse generator 17, and a controller 15. The pulse generator 17 and the sensing unit 13 are both electrically connected to the memory cell array 11 and the controller 15.

The memory cell array 11 includes a plurality of non-volatile memory cells (not shown). The non-volatile memory cells may be NOR flash memory, NAND flash memory, ReRAM and PCM etc. For the sake of convenience, the memory cells are assumed to be PCM cells in the following embodiments. However, concept of the present invention can also be applied to other types of non-volatile memories.

The controller 15 controls the pulse generator 17 to generate a testing pulse, which is used for programming the memory cells. Duration and amplitude of the testing pulse are respectively shorter and smaller than a normal RESET/SET pulse. Thus, storage state of the memory cell being applied with the testing pulse will not change. In a read operation, the sensing unit 13 senses cell data stored in memory cells. The cell data may accordingly represent characteristic of the memory cells.

Data stored in the memory cell becomes unreliable when a memory cell failed. Thus, knowing aging degree of the memory cell is important in managing the memory device. When the memory cell ages, programming strength required to access the memory cell, such as strength of programming current/voltage/heat, programming cycles and programming duration etc, also changes. Change of the programming strength results from characteristic deviation of the memory cell, which occurs when the memory cell is close to the end of its lifetime. The characteristic deviation of the memory cell is sensed by the sensing unit 13 and further utilized by the controller 15.

The objective of this invention is to inspect whether characteristic of the memory cell deviates. Result of inspecting the memory cell is informative for upper layer management (e.g. wear leveling). Application of the upper management of the memory cell array is flexible and should not be limited.

Figure 1:
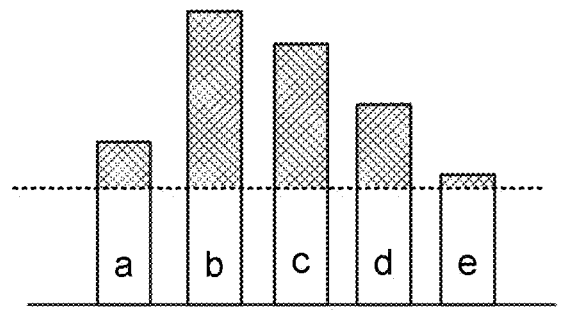
FIG. 1 (prior art) is a schematic diagram illustrating a conventional wear leveling algorithm with a conservative approach.
Figure 2:
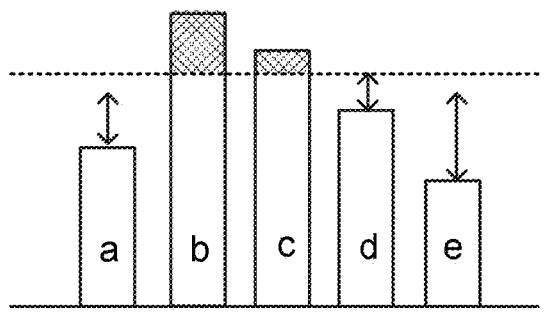
FIG. 2 (prior art) is a schematic diagram illustrating a conventional wear leveling algorithm with an aggressive approach.
Figure 4:
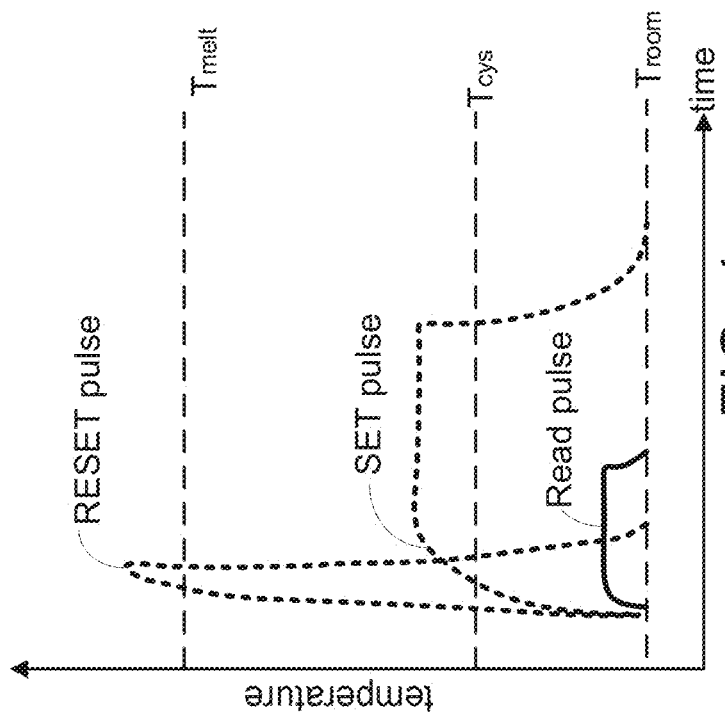
FIG. 4 is a schematic diagram illustrating temperature-time relationship of a PCM cell.

FIG. 4 is a schematic diagram illustrating temperature-time relationship of a PCM cell. The PCM cell consists of both top and bottom electrodes with a phase change material, such as Ge2Sb2Te5 (GST), or GeTe—Sb2Te3 etc., sandwiched in between. When a voltage/current pulse is applied to the top and bottom electrodes, temperature of the phase change material increases. Consequentially, the phase change material may transform between an amorphous state and a crystalline state.

During a reading process, a small current pulse (i.e. a READ pulse) is applied to the PCM cell. During the READ pulse, a temperature of the phase change material is slightly higher than the room temperature $T_{room}$, but not high enough to transform the state of the PCM cell. Thus, data stored in the PCM cell is not disturbed during the READ pulse.

In order to switch the PCM cell from the off state (i.e. the amorphous state) to the on state (i.e. the crystalline state), a SET pulse is applied to the memory cell. The SET pulse is with a relatively lower current pulse and applied to the PCM cell for a relatively longer duration. Consequently, temperature of the phase change material will be higher than the crystalline temperature Tcys. After the SET pulse is applied, the PCM cell changes from the high resistive state to the low resistive state.

In order to switch the memory cell from the on state (i.e. a crystalline state) to the off state (i.e. an amorphous state), a RESET pulse is applied to the memory cell. The RESET pulse is with a relatively high current pulse and applied to the memory cell in a very short duration. During the RESET pulse, temperature of the phase change material is higher than the amorphous temperature Tmelt. After the RESET pulse is applied, the memory cell changes from the low resistive state to the high resistive state.

As mentioned above, the memory cell transits from the low resistive state to the high resistive state in a RESET operation. However, with the aging of the memory cell, such transition process between resistive states is not always consistent. FIGS. 5 and 6 indicate how the transition process between resistive states of the PCM cell varies when the PCM cell becomes aged.

FIG. 5 is a schematic diagram illustrating resistance versus current (R-I) curves for a healthy memory cell in the RESET operation. The first R-I curve (1) corresponds to the memory cell at initial state. The second R-I curve (2) corresponds to the memory cell after 5 cycles of RESET programming. The third R-I curve (3), the fourth R-I curve (4) and the fifth R-I curve (5) respectively correspond to the memory cell after 10 cycles, 100 cycles and 1000 cycles of RESET programming. In FIG. 3, the arrow indicates that when the cycle count of RESET programming increases, the R-I curve will gradually move rightward. The rightward movement of the R-I curve represents the healthy memory cell becomes more resistive to programming current.

FIG. 6 is a schematic diagram illustrating resistance versus current curves for a dying memory cell in a RESET operation. The first R-I curve (1), the second R-I curve (2), the third R-I curve (3), the fourth R-I curve (4), and the fifth R-I curve (5) respectively correspond to the memory cell after $4.17 \times 10^7$, $4.18 \times 10^7$, $4.19 \times 10^7$, $4.20 \times 10^7$, and $4.21 \times 10^7$ cycles of RESET programming.

Unlike the R-I curves in FIG. 5, the third, the fourth and the fifth R-I curves (3) (4) (5) in FIG. 6 are located at relatively left side of the first and the second R-I curves (1) (2). Furthermore, the horizontal fifth R-I curve (5) represents the resistance of the memory cell no longer changes with the RESET programming, i.e. the memory cell is at a state of cell open. In other words, the memory cell is dead after $4.21 \times 10^7$ cycles of RESET programming.

The leftward movement of the third, the fourth and the fifth R-I curves (3), (4), (5) are inconsistent with the other R-I curves in FIGS. 5 and 6. This phenomenon may be interpreted as that the dying memory cell becomes more responsive to programming current.

According to the R-I curves shown in FIGS. 5 and 6, the memory cell has an apparent characteristic deviation phenomena after $4.18 \times 10^7$ cycles of RESET programming. According to FIG. 6, tendency change of the third R-I curve (3) is relatively abrupt. After the leftward movement of the third R-I curve (3), the memory cell becomes dead soon. Therefore, the sudden leftward movement of the third R-I curve (3) is considered as a sign indicating that the memory cell is about to be dead. Thus, deviation of the R-I curve may suggest the memory cell is nearing end of its lifetime.

Figure 7:
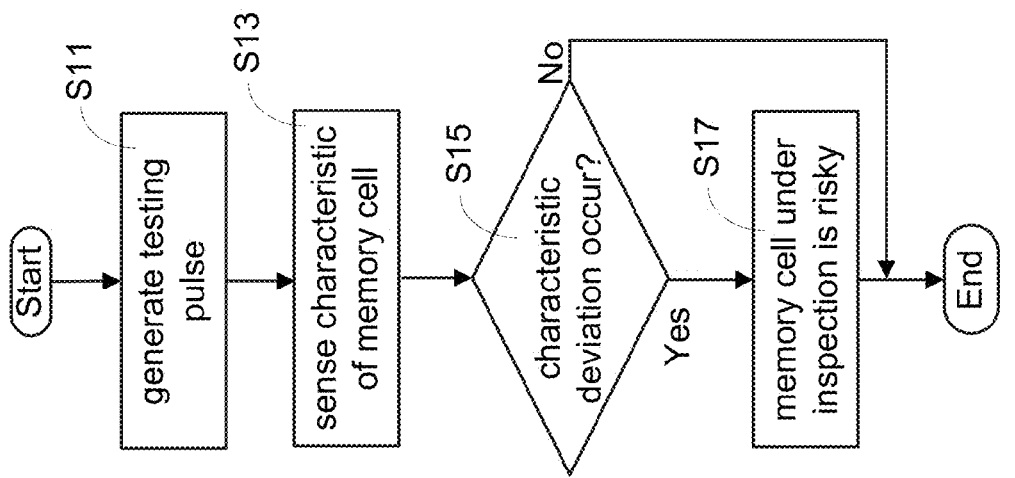
FIG. 7 is a flow chart illustrating inspection process of the memory cell.

FIG. 7 is a flow chart illustrating inspection process of the memory cell. According to the present invention, the memory cells in the memory cell array 11 can be individually inspected. Actual timing of proceeding the inspection process to the memory cell is not limited. For instance, the inspection process can be proceeded in a pre-programming stage, inserted in a RESET/SET programming stage, or executed in a specific and separate inspection stage.

Firstly, a testing pulse is generated by the pulse generator 17 and transmitted to the memory cell array 11 (step S11). Then, the sensing unit 13 senses characteristic of the memory cell (step S13). The controller 15 further determines whether the characteristic deviation of the memory cell occurs (step S15).

The determination result of step S15 dominates managing method of the memory cell array. When the determination result of step S15 is negative, the memory cell under inspection is determined to be healthy. Thus, the controller 15 does not need to react the inspection process but utilizes the healthy memory cell normally.

On the other hand, the memory cell under inspection is about to fail if characteristic of the memory cell under inspection deviates. In such case, the controller 15 will determine the memory cell under inspection is risky (step S17). Consequently, the controller 15 will avoid accessing the memory cells which are determined to be risky.

Figure 8:
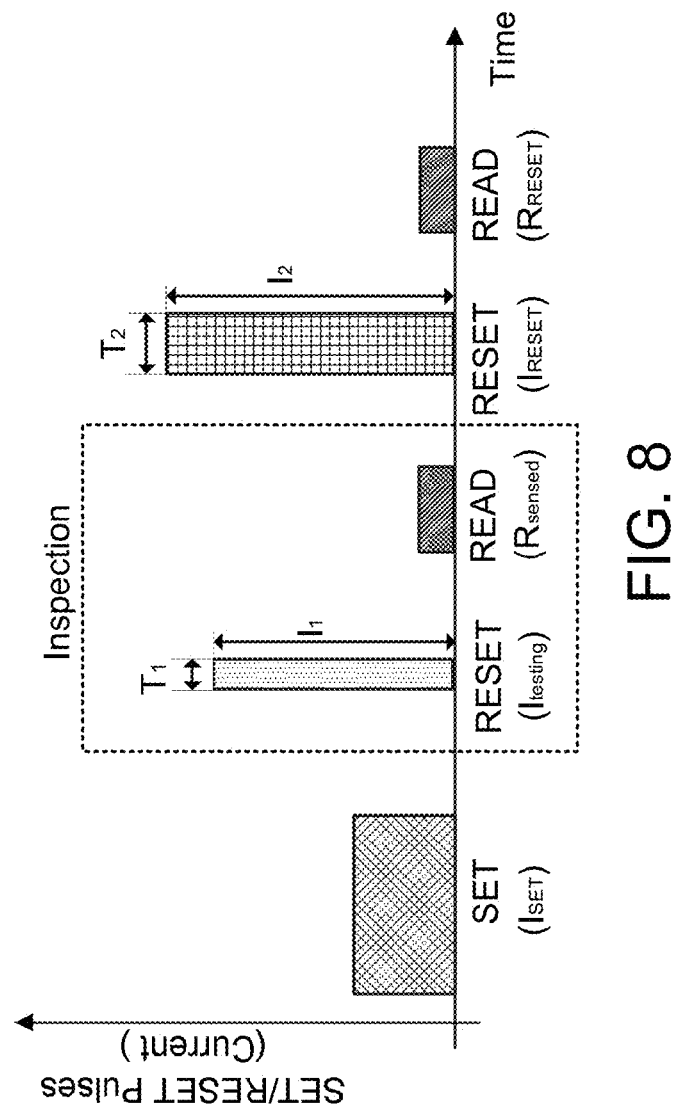
FIG. 8 is a schematic diagram illustrating the testing pulse is applied to the memory cell prior a normal RESET pulse.

FIG. 8 is a schematic diagram illustrating the testing pulse is applied to the memory cell prior a normal RESET pulse. The testing pulse may be aroused by a current, a voltage or a heat, and the testing pulse may be with different amplitudes and/or durations. After the testing pulse, the resistance of the memory cell can be sensed via a normal READ pulse. The sensed result is further analyzed and referred to determine whether characteristic deviation exists.

According to an embodiment, the testing pulse may be in a form of a partial-RESET current. The resistance of the memory cell corresponding to the partial-RESET current is accordingly monitored and sensed. The pulse width (i.e duration) of the testing pulse (T1) is shorter than the pulse width of a normal RESET pulse (T2). And, the current amplitude of the testing pulse (e.g. I1=150 uA)) is smaller than the current amplitude of the normal RESET pulse (e.g. I2=400 uA)). Thus, the testing pulse will not affect data content stored in the memory cell.

Figure 9:
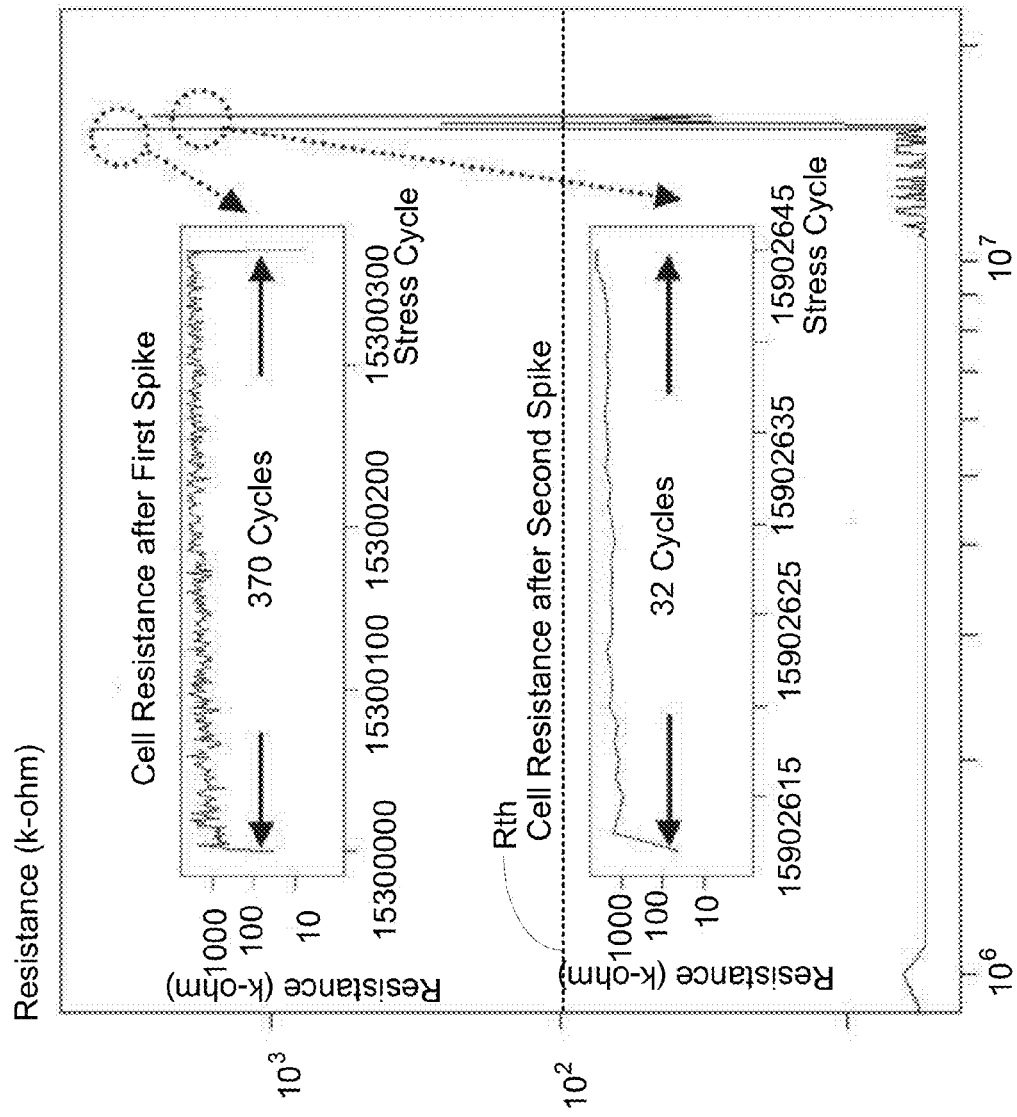
FIG. 9 is a schematic diagram illustrating spikes generated a short time before failure of the memory cell.

FIG. 9 is a schematic diagram illustrating the cell resistance resulted from partial-RESET pulses. As shown in FIG. 9, upward spikes were generated a short time before failure of the memory cell. A first and a second spikes are close to the right of FIG. 9. The resistance of the memory cell corresponding to stress cycles (programming cycles) following the first and the second spikes are enlarged in FIG. 9.

After the first spike occurs, the extremely high resistance value will sustain for 370 cycles. After the second spike occurs, the extremely high resistance value will sustain for another 32 cycles. That is, even if the memory cell is not detected at the exact cycle when the first or the second spike occurs, the characteristic deviation will last for a duration and can still be detected afterwards. Therefore, sensing unit 13 does not need to monitor resistance of the memory cell every cycle and overhead of executing inspection process can be accordingly minimized. An example of executing the inspection process once every 10 cycles will be illustrated in FIG. 10.

In practical application, tendency of resistance of the memory cell could be converted into logical signal according to a predefined threshold of resistance. After the resistance of the memory cell is sensed, the controller 15 compares the predefined threshold of resistance Rth with the sensed result. Consequentially, a logical "0" may be conducted when the sensed resistance is less than the predefined threshold of resistance; and a logical "1" may be conducted when the sensed resistance is equivalent to or greater than the predefined threshold of resistance Rth. In FIG. 9, the predefined threshold of resistance Rth is assumed to be $10^2$ k-ohm and shown by the dotted line.

Figure 10:
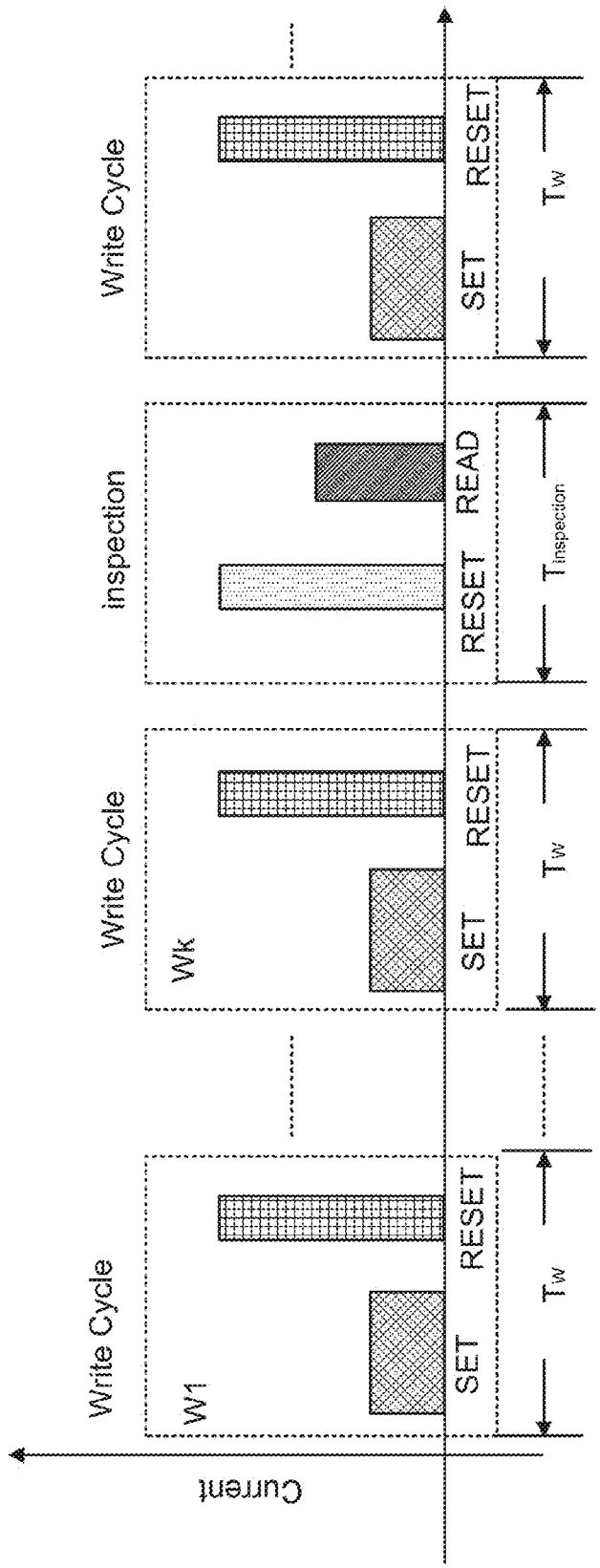
FIG. 10 is a schematic diagram illustrating the inspection process is proceeded every few cycles.

FIG. 10 is a schematic diagram illustrating the inspection process is preceded every few cycles. As mentioned above, the inspection process does not need to be performed every cycle since the characteristic deviation lasts for cycles. In FIG. 10, k represents how often the inspection process is executed. $T_{inspection}$ represents duration of the inspection process and $T_W$ represents duration of the normal write cycle. Thus, latency overhead caused by the inspection process in FIG. 10 can be defined as $T_{inspection}/(T_W*k)$.

According to the function of $T_{inspection}/(T_W*k)$, the latency overhead caused by the inspection process is 2.22% in a case that k is assumed to be 10, duration of the inspection process $T_{inspection}$ is assumed to be 200 ns and duration of the normal write cycle is assumed to be 900 ns. The latency overhead can be reduced if the frequency of executing inspection process is reduced, i.e. k is greater.

Figure 11:
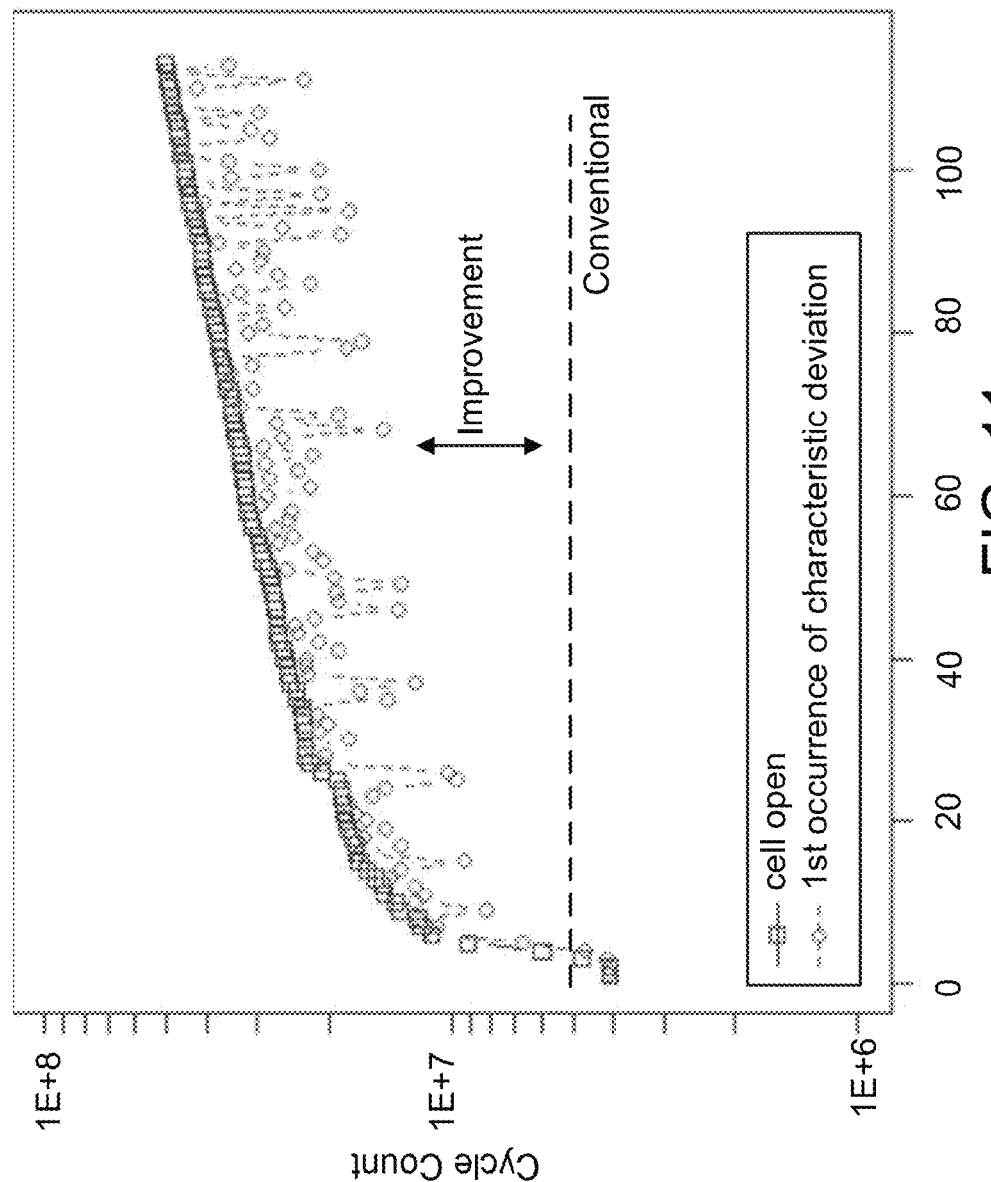
FIG. 11 is a schematic diagram illustrating inspection results and failures of the memory cells.

FIG. 11 is a schematic diagram illustrating inspection results and failures of the memory cells. The data in FIG. 11 are sorted by cell endurance in ascending manner. The squares represent the exact cycles when the memory cells are dead, the rhombuses represent when characteristic deviation of the memory cells occur, and the dotted line represents the specific threshold of programming cycle count as defined by the conventional assumption.

The double headed arrow indicates differences between the rhombuses and the dotted line and represents endurance of the memory cells being saved via the inspection process.

FIG. 12 is a schematic diagram illustrating a programming method according to an embodiment of the present invention. In FIG. 12, two testing pulses are applied to the memory cell prior to a normal RESET pulse. Accompanied with the two testing pulses generated by the pulse generator 17, the sensing unit 13 accordingly senses two sensed resistances of the memory cell. Current amplitudes of the two testing pulses applied to the memory cell are not necessary to be equivalent. Furthermore, number of testing impulses is not limited.

The inspection process is a concept of applying at least one testing pulse, accordingly sensing characteristic of the memory cells and determining whether the memory cell is dying by referring to the sensed characteristics. Implementation of the inspection process is very flexible and can be combined together with current non-volatile memory technologies. For instance, the inspection process can be applied to single-level cell (hereinafter, SLC), multi-level cell (hereinafter, MLC) and triple-level cell (hereinafter, TLC) memory technologies. For programming an MLC memory cell, an incremental step pulse programming (hereinafter, ISPP) process is proposed.

FIG. 13 is a schematic diagram illustrating testing pulse is merged to ISPP of a RESET operation. By performing the ISPP process, the storage state of the memory cell is increased in a step pattern. When a memory cell is programmed using the ISPP method, the program pulse is increased through a sequence of steps until programming is completed. By merging the testing pulse as one of the ISPP steps, the overhead of inspection can be reduced.

Figure 14:
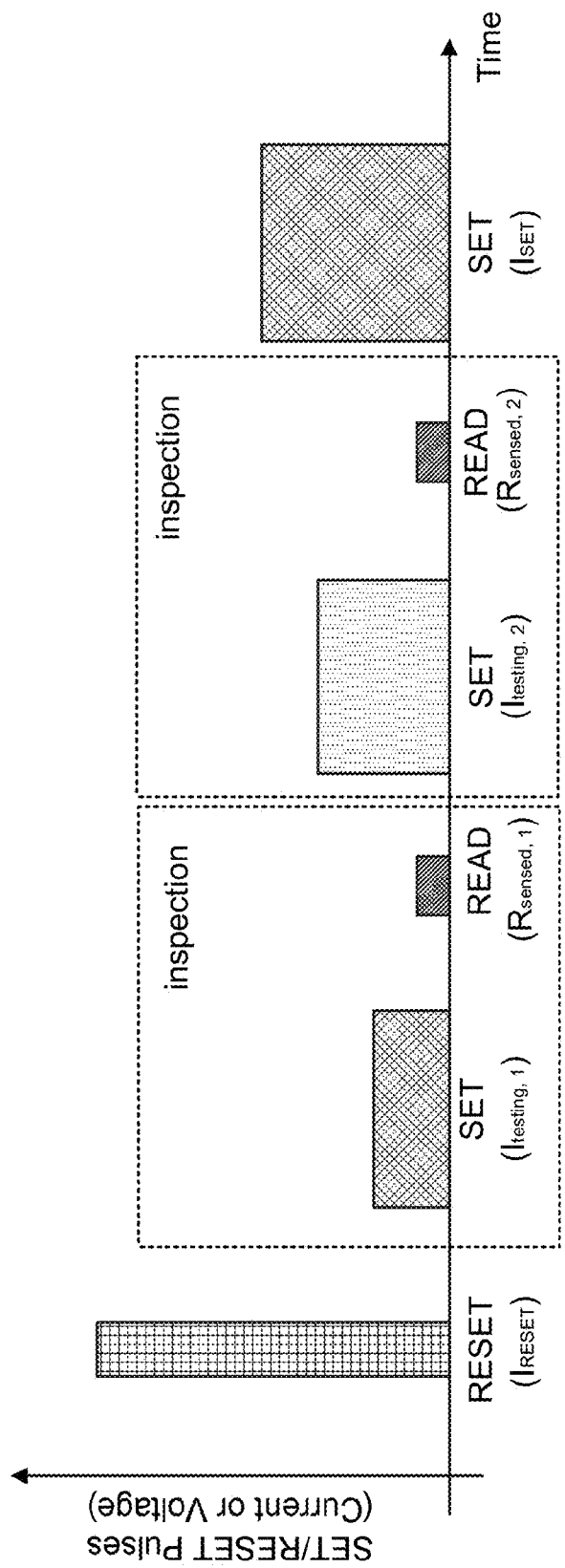
FIG. 14 is a schematic diagram illustrating two testing pulses are applied to the memory cell prior a normal SET pulse.

Alternatively, the inspection process can be applied to a SET operation. FIG. 14 is a schematic diagram illustrating two testing pulses that are applied to the memory cell prior a normal SET pulse. According to FIG. 4, duration of the SET pulse is longer than that of the RESET pulse, and the amplitude of the SET pulse is smaller than that of the RESET pulse. However, the concept of implementing inspection process in the SET operation is similar to that in the RESET operation.

In a first inspection process, a first testing pulse ($I_{testing, 1}$) is applied to the memory cell, and a first resistance of the memory cell ($R_{sensed, 1}$) is accordingly sensed. In a second inspection process, a second testing pulse ($I_{testing, 2}$) is applied to the memory cell, and a second resistance of the memory cell ($R_{sensed, 2}$) is accordingly sensed. Amplitude of the first and the second testing pulses are smaller than that of the normal SET pulse ($I_{SET}$). Duration of the first and the second testing pulses are shorter than that of the normal SET pulse.

The characteristic deviation is a phenomenon accompanied with failure of memory cell. In fact, the characteristic deviation indicates a sign of failure in advance and represents that the memory cell becomes weak. In other words, when the characteristic deviation occurs, the memory cell has become relatively easily to be programmed. It should be understood that various characteristics of memory cells may also be sensed in the inspection process.

FIGS. 15A, 15B, 15C and 15D are schematic diagrams illustrating several types of characteristic deviations according to the embodiment of the present invention. The dotted circles in FIGS. 15A, 15B, 15C and 15D circulate when and how the characteristic deviations occur.

Figure 15C:
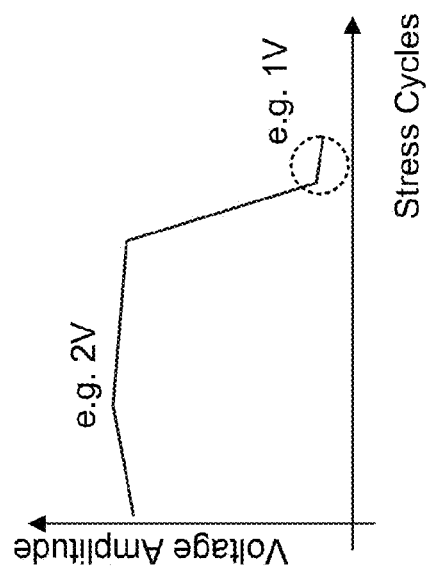
FIGS. 15A, 15B, 15C and 15D are schematic diagrams illustrating several types of characteristic deviations according to the embodiment of the present invention.
Figure 15D:
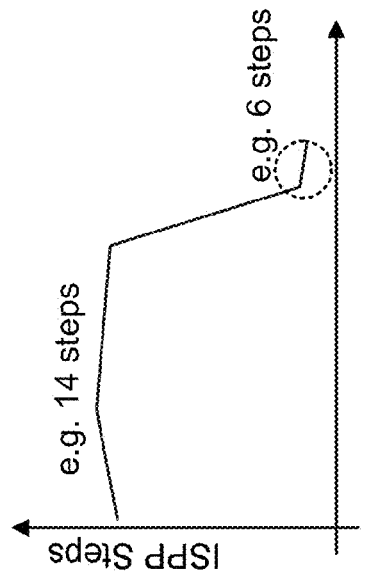
Figure 15A:
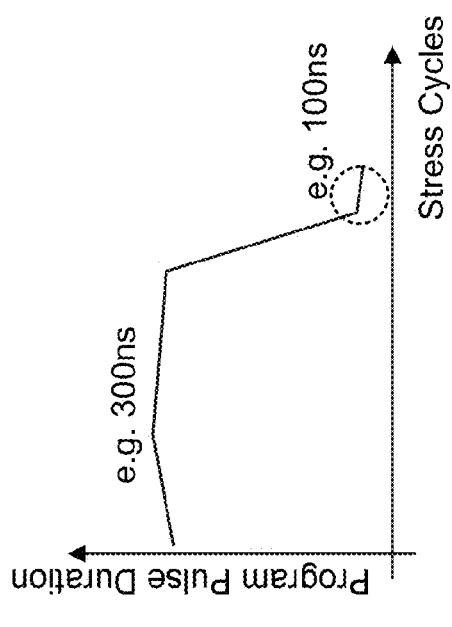

In FIG. 15A, program pulse duration is detected. Usually, the program pulse duration is about 300 ns when the memory cell is healthy. On the other hand, a sharp drop of the program pulse duration indicates the memory cell is dying. For instance, the program pulse duration will dramatically change from 300 ns to 100 ns.

Figure 15B:
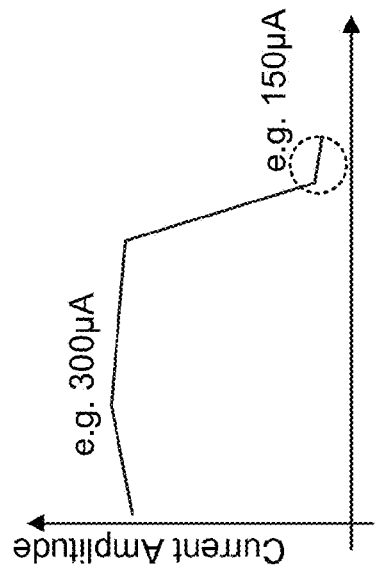

Similarly, current amplitude, voltage amplitude, and ISPP steps are referred as indications for aging of the memory cell. In FIG. 15B, the current amplitude drops from 300 µA to 150 µA. Such dramatic change of the current amplitude can be considered as characteristic deviation. In FIGS. 15C and 15D, the characteristic deviations are identified by significant dropping of the voltage amplitude (from 2V to 1V) and the increased number of ISPP steps (from 14 steps to 6 steps).

Please refer to FIGS. 16A, 16B, 17A to 17G, 18, and 19. A wear leveling algorithm based on the inspection process is provided. According to an embodiment of the present invention, the memory device may include plural memory cell arrays and each of the memory cell arrays can be further classified into storage units. For the sake of convenience, the following illustration assumes the memory device includes only one memory cell array and the memory cell array includes only one storage unit.

Figure 16A:
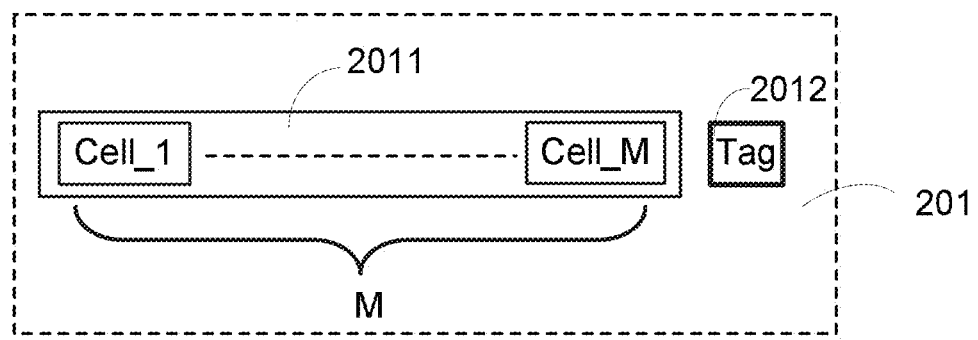
FIG. 16A is a schematic diagram illustrating a memory group.

FIG. 16A is a schematic diagram illustrating a memory group. A memory group is assumed to include plural (M) memory cells and has a tag. In this embodiment, the tag is 1-bit.

Figure 16B:
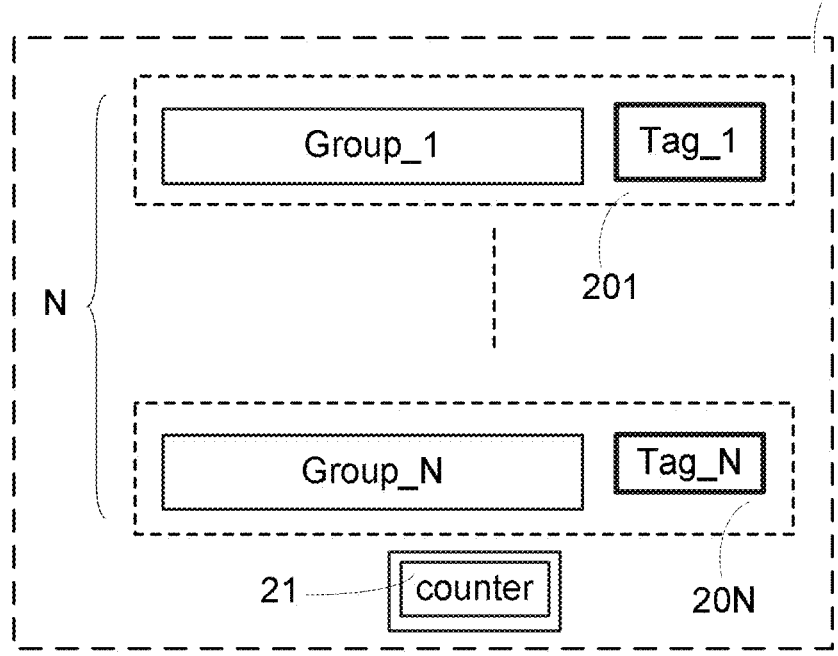
FIG. 16B is a schematic diagram illustrating a storage unit.

FIG. 16B is a schematic diagram illustrating a storage unit. The storage unit 20 is assumed to include plural (N) memory groups 201, . . . 20N and corresponding a counter 21. Each memory group is corresponding to a tag.

In this embodiment, counter value of the counter 21 is accumulated when all tags of the memory groups in the storage unit 20 are set to "1". Format and length of the counter 21 are not limited. Once the accumulated counter value is equivalent to a maximum counting value, the controller 15 will stop accessing the storage unit 20. The maximum counting value represents the allowable errors can be corrected by the ECC algorithm.

FIGS. 17A, 17B, 17C, 17D, 17E, 17F, and 17G are schematic diagrams illustrating an exemplary storage unit utilizing the wear leveling algorithm based on inspecting characteristic deviation of memory cells. For the sake of convenience, the storage unit 30 has only two memory groups and each of the memory groups has four memory cells. In FIGS. 17A-17G, the dead memory cells are shown in screentone.

Figure 17A:
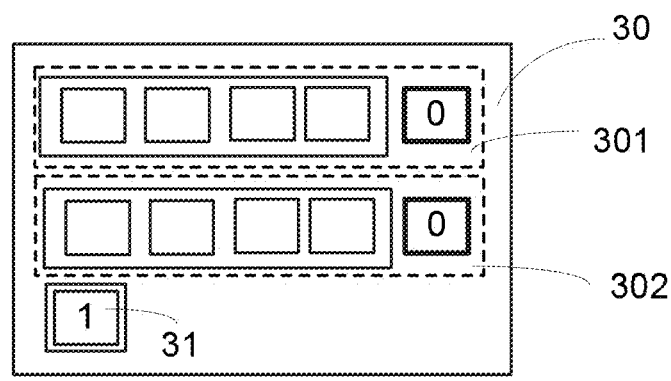
FIGS. 17A, 17B, 17C, 17D, 17E, 17F, and 17G are schematic diagrams illustrating an exemplary storage unit utilizing the wear leveling algorithm based on inspecting characteristic deviation of memory cells.
Figure 17D:
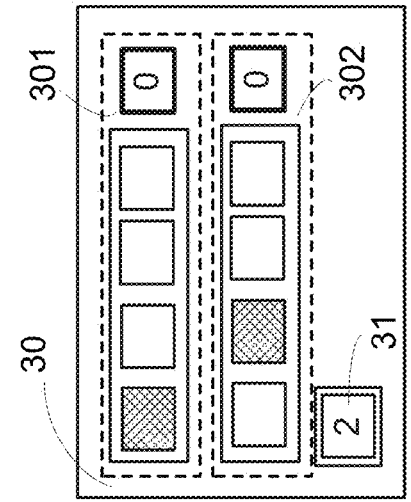
Figure 17G:
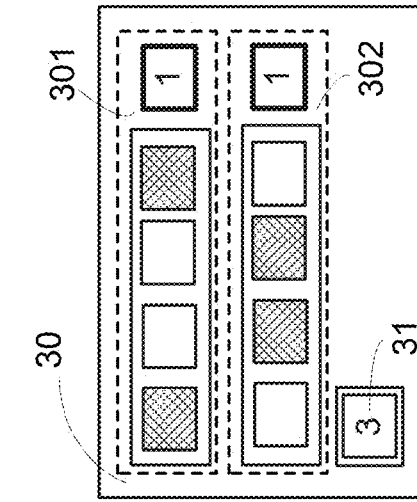

Refer to FIG. 17A. At beginning, tags of the two memory groups are all reset to "0", and the counter 31 of storage unit 30 is set to be "1". When the controller 15 intends to write data to the storage unit 30, memory cells of both the first memory group 301 and the second memory group 302 are all inspected. In a case that the first memory group 301 has a risky memory cell as shown in screentone, tag of the first memory group 301 is set to "1" (see FIG. 17B).

When the controller 15 selects again the storage unit 30 to write, all memory cells of the first and the second memory groups 301, 302 are inspected. It is assumed a memory cell in the second memory group 302 is determined to be risky. In such case, tag of the second memory group 302 is also set to "1" (see FIG. 17C). As both tags of the first and the second memory groups are set to "1", the counter 31 is increased by 1. Comparing FIGS. 17C and 17D, the tags of the first and the second memory groups are cleared to "0" and the counter value changes from one to two.

Figure 17C:
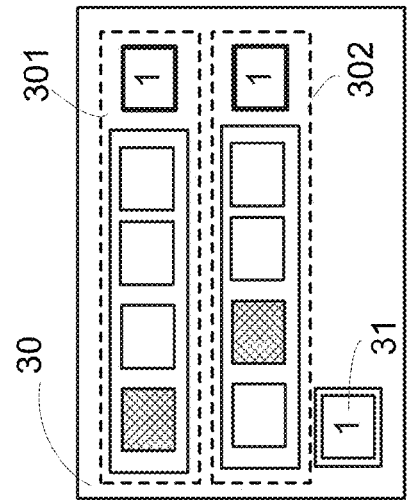
Figure 17F:
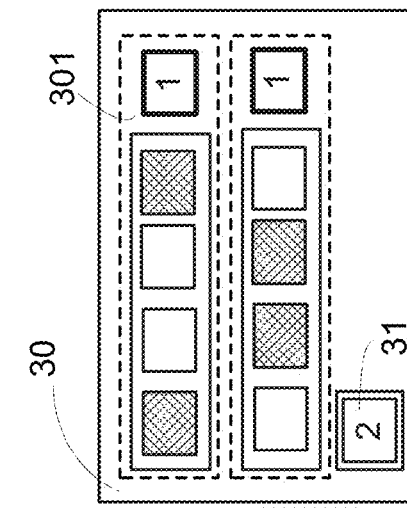
Figure 17B:
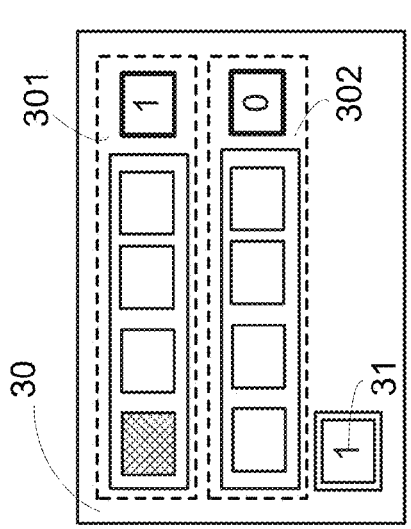
Figure 17E:
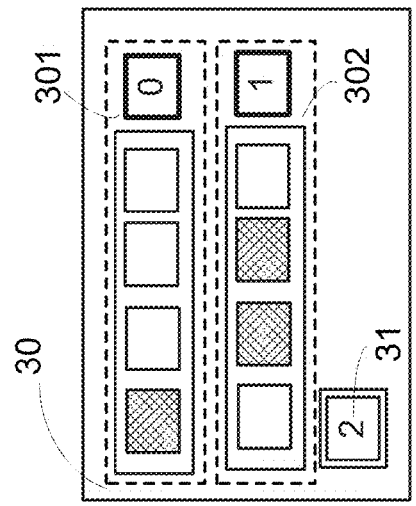

Details of FIGS. 17E and 17F are similar to the ones in FIGS. 17B and 17C. That is to say, when the controller 15 intends to write data to the storage unit 30, all memory cells of memory groups in the storage unit 30 are inspected.

Refer to FIG. 17E. It is assumed that inspection of the first memory group 301 indicates that one risky memory cell exists in the first memory group 301. Number of risky cells belonging to the first memory group (1) is thus compared with the counter value of the storage unit 30 (2). Since the number of risky cells belonging to the first memory group 301 (1) is less than the counter value (2), the tag of the first memory group 301 remains to be "0". On the other hand, inspection of the second memory group 302 indicates that two risky memory cells exist in the second memory group 302. Number of risky memory cells in the second memory group (2) is thus compared with the counter value (2). Since the value of the tag of the second memory group 302 (2) is equivalent to the counter value (2), the tag 302 is set to be "1".

Refer to FIG. 17F. It is assumed that the inspection of the first memory group 301 indicates that two risky memory cell exists in the first memory group 301. Number of risky memory cells (2) is again compared with the counter value (2). Since the number of risky memory cells (2) is equivalent to the counter value (2), the tag of the first memory group 301 is set to "1". On the other hand, inspection of the second memory group 302 indicates that two risky memory cells exist in the second memory group 302. Number of risky memory cells in the second memory group (2) is again compared with the counter value (2). Since the number of risky memory cells in the second memory group (2) is equivalent to the counter value, the tag of the second memory group 302 remains to be "1".

As both tags of the first and the second memory groups are set to "1", the counter value of the counter 31 is increased by one. Thus, the counter value is updated by "3" (see FIG. 17G). Difference between the maximum counting value and the initial counter value (3−1=2) represents the maximum number of memory cells with errors can be corrected by the ECC algorithm.

If the counter value is equivalent to the maximum counting value, this implies that the ECC algorithm reaches its limitation. Thus, when the counter value is equivalent to the maximum counting value (3), the controller 15 will stop accessing the storage unit 30. The wear leveling algorithm ensures that number of risky cells belonging to each memory group are even (less than or equal to the counter value), and prolongs endurance of the memory cell array.

Figure 18A:
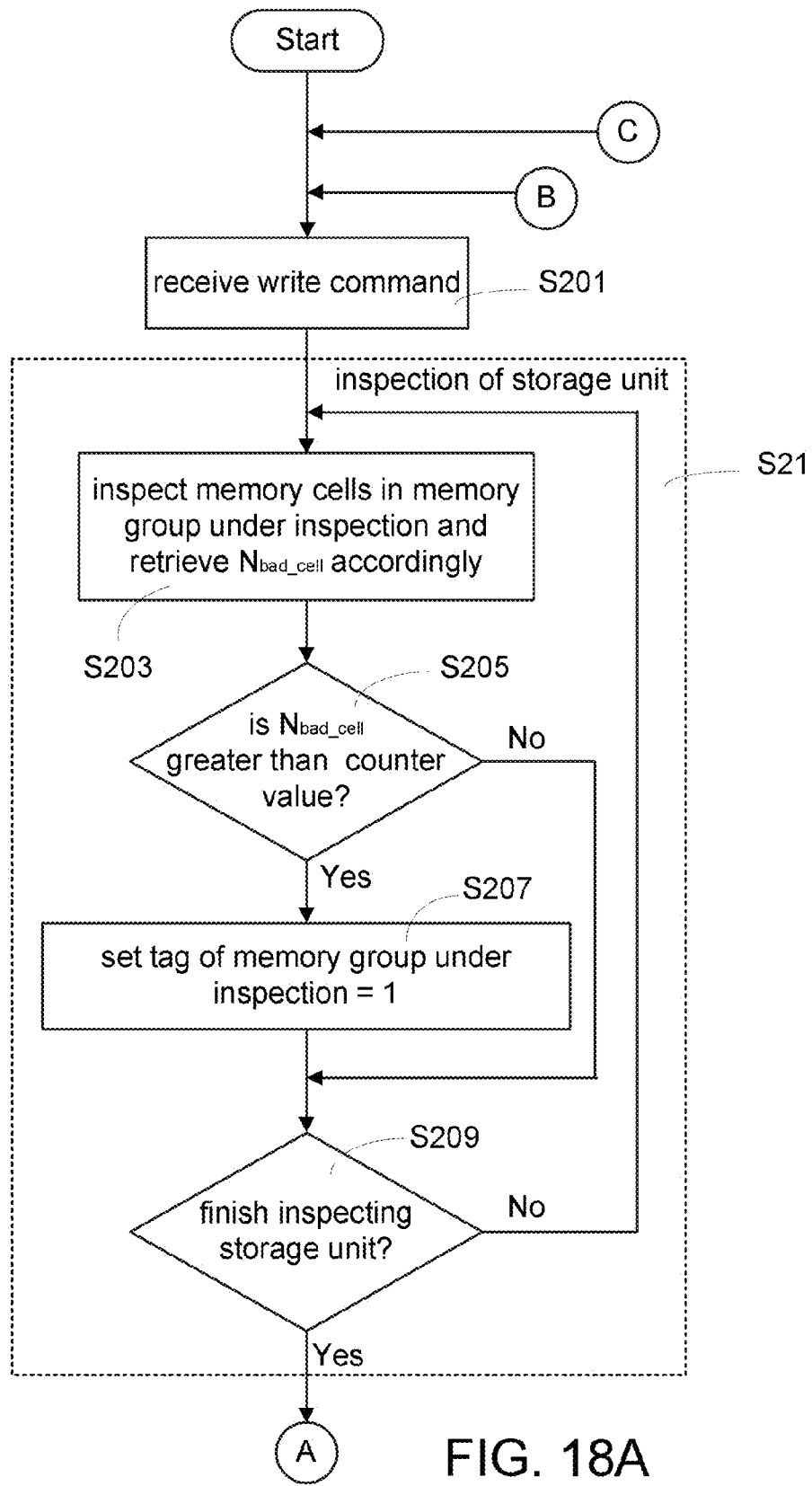
FIGS. 18A and 18B are flow charts illustrating an embodiment of the wear leveling algorithm based on inspection.
Figure 18B:
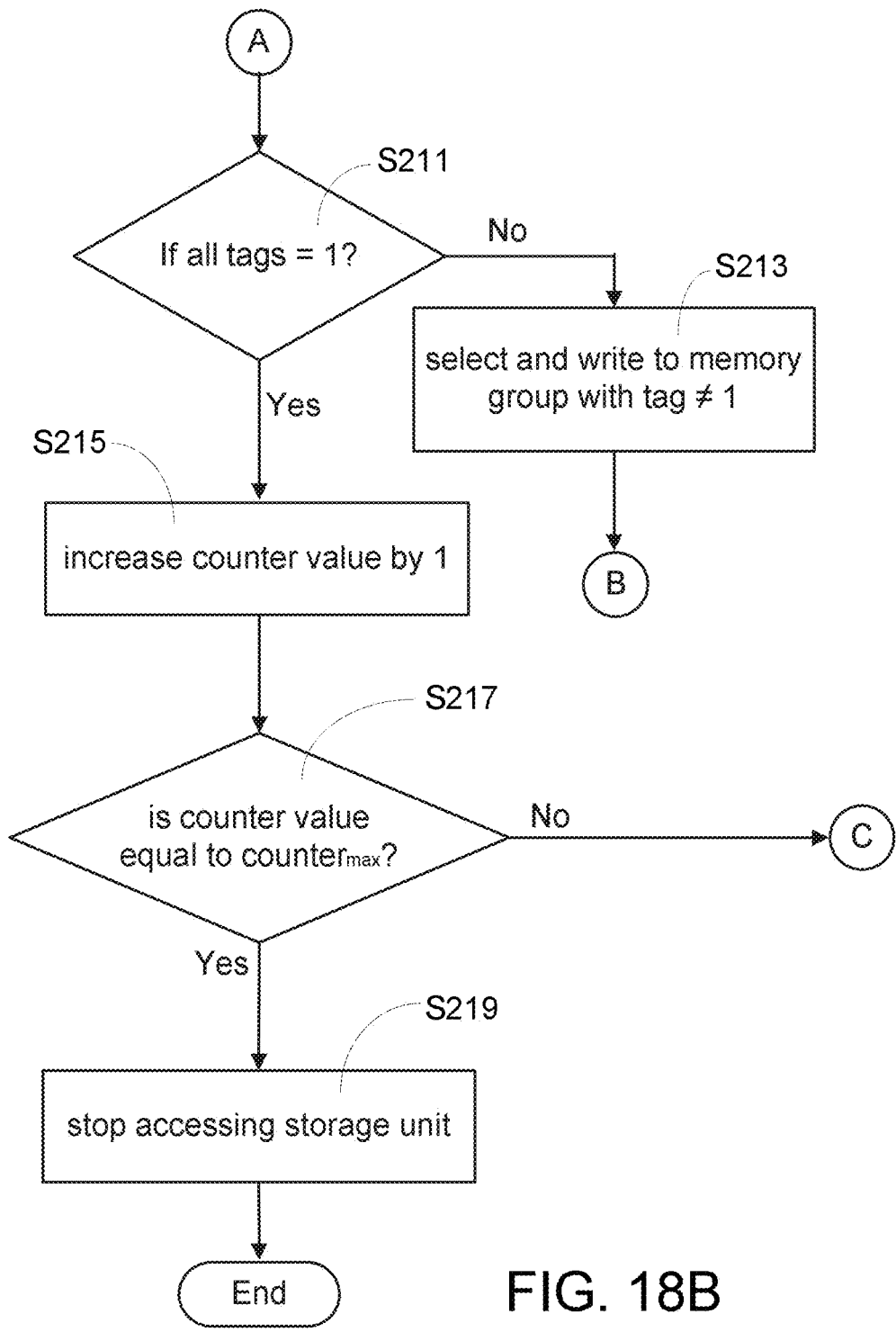

FIGS. 18A and 18B are flow charts illustrating an embodiment of the wear leveling algorithm based on inspection. Firstly, the controller 15 receives a write command (step S201). Then, the controller 15 inspects memory groups in the storage unit with assistance of the pulse generator 17 and the sensing unit 13 (step S21). The step S21 includes several sub-steps which are iteratively executed for each of the memory groups in the storage unit.

The controller 15 selects one of the memory groups as a memory group under inspection. The memory cells contained in the memory group under inspection are then inspected. Inspection results of the memory cells contained in the memory group under inspection indicate number of risky memory cells in the memory group under inspection ($N_{bad\_cell}$). The amount of risky memory cells in the memory group under inspection ($N_{bad\_cell}$) is compared with the counter value of the counter corresponding to the storage unit (step S205). If the amount of risky memory cells in the memory group under inspection ($N_{bad\_cell}$) is equivalent to or greater than the counter value, tag of the memory group under inspection is set to "1" (step S207). Then, the controller 15 determines whether all memory groups in the storage unit are inspected (step S209). If not, step S21 is repeatedly executed.

If determination result of step S209 is positive, the controller 15 examines whether all tags of the memory groups in the storage unit are set as "1" (step S211). If determination result of the step S211 is negative, the controller 15 selects and writes data to the memory group whose tag is not set to "1" (step S213). If determination result of step S211 is positive, the counter value is increased by one (step S215).

Later, the counter value is compared with the maximum counting value (step S217). If the counter value is less than the maximum counting value, the storage unit is capable of being written more data. Thus, the controller 15 will wait for another write command. If the counter value is equivalent to the maximum counting value, the storage unit is not capable of being written any more data. Thus, the controller 15 will stop accessing the storage unit (step S219).

As manufacturing process variation may cause difference between memory cells in the memory cell array. A fixed specific threshold of programming cycle count is not suitable for all memory cells. Therefore, the above wear leveling is based on results of inspection processes applied to the memory cells. Comparing to the conventional wear leveling algorithms, the proposed inspection based wear leveling algorithm gains 67.2% endurance. Furthermore, the latency penalty of the present invention is less than 2.22% and area overhead is only 3.4%.

The following table illustrates the simulation result according to the present embodiment. Several combinations with different number of memory groups in a storage unit, and different number of memory cells in a memory group are simulated. The fields in the table (from left to right) respectively represent memory cell number per memory group (M), memory group number per storage unit (N), maximum counting value ($counter_{max}$), average of counter value ($counter_{avg}$), endurance gain, area overhead and latency overhead.

|     |     | Counter |     | Endurance | Area | Latency |
| --- | --- | --- | --- | --- | --- | --- |
| M | N | max | avg | gain (%) | overhead (%) | overhead (%) |
| 128 | 8 | 6 | 3.4 | 17.1% | 1.1% | 2.2% |
| 64 | 16 | 7 | 2.8 | 40.7% | 1.9% | 2.2% |
| 32 | 32 | 5 | 2.5 | 67.2% | 3.4% | 2.2% |

In the second row of the table, 128 memory cells per memory group, and 8 memory groups per storage unit are assumed. In such case, the maximum counting value is 6 and the average of counter value is 3.4. The endurance gain of the memory cell array is 17.1%. The area overhead is 1.1% and latency overhead is 2.22%.

In the third row of the table, 64 memory cells per memory group, and 16 memory groups per storage unit are assumed. In such case, the maximum counting value is 7 and the average value of counter is 2.8. The endurance gain of the memory cell array is 40.7%. The area overhead is 1.9% and latency overhead is 2.22%.

In the fourth row of the table, 32 memory cells per memory group and 32 memory groups per storage unit are assumed. In such case, the maximum counting value of counter is 5 and the average value of counter is 2.5. The endurance gain of the memory cell array is 67.2%. The area overhead is 3.4% and latency overhead is 2.22%.

Based on simulation results shown in the table, the endurance gain dramatically increases when the concept of inspection process is used in wear leveling algorithm. Meanwhile, the area overhead and the latency overhead are extremely low.

Figure 19:
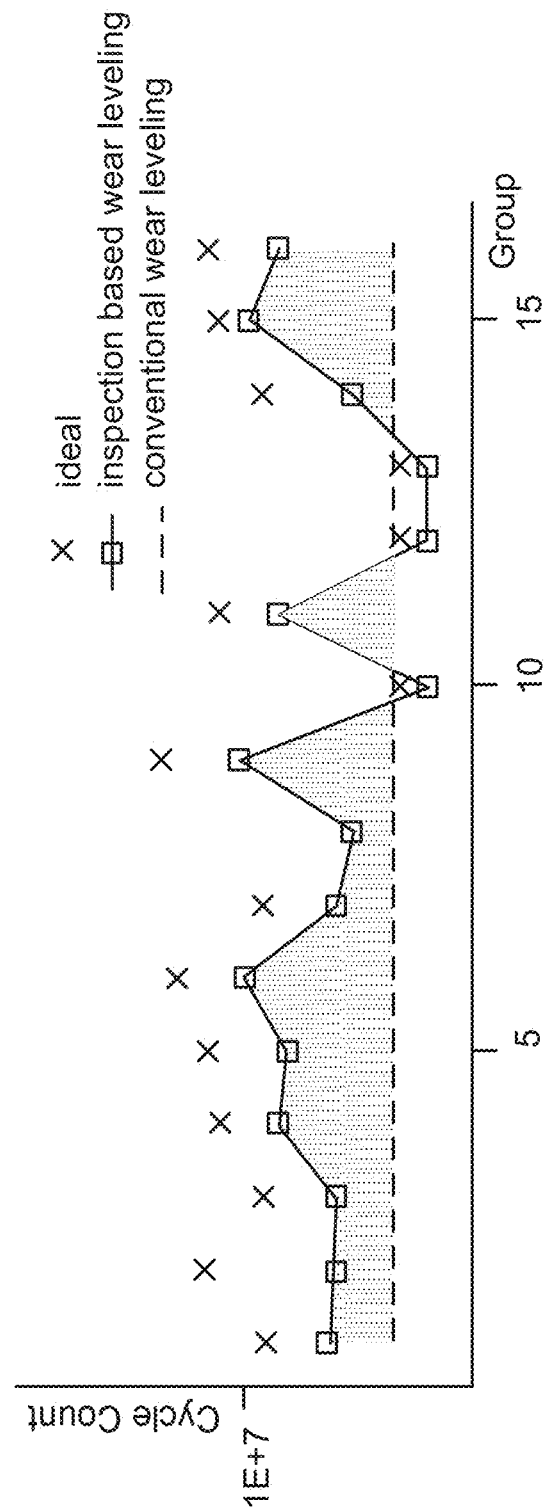
FIG. 19 is a schematic diagram illustrating simulation result based on a scheme of 64 memory cells per memory group and 16 memory groups per storage unit.

FIG. 19 is a schematic diagram illustrating simulation result based on a scheme of 64 memory cells per memory group and 16 memory groups per storage unit. In FIG. 19, the crosses represent the ideal case of the endurance of each group. The squares represent the simulation result of the wear leveling algorithm based on the inspection approach. The straight dotted line represents the simulation result of the conventional approach. The shaded area indicates the endurance gain. Positions of the squares are all below position of the crosses. Thus, the inspection based wear leveling algorithm can always successfully detect whether health status of the memory group becomes worse in advance. The health status of the memory group can be determined by the number of risky memory cells in the memory group.

In a case that real endurance of a memory group is greater than the specific threshold of programming cycle count as assumed in the conventional approach (i.e. memory groups 1, 2, 3, 4, 5, 6, 7, 8, 9, 11, 14, 15, and 16 in FIG. 19), the difference between the squares and the dotted line imply the endurance gain of the present invention. In a case that real endurance of a memory group is less than the specific threshold of programming cycle count as assumed in the conventional approach (i.e. memory groups 10, 12, 13 in FIG. 19), the differences between the squares and the dotted lines represent where the data loss may happen by the conventional approach but are capable being avoided by the present invention. For such memory groups (i.e. memory groups 10, 12, and 13 in FIG. 19), an ECC algorithm is required to compensate the data loss issue.

The inspection process can be implemented by software or hardware MMU. The wear leveling algorithm can be incorporated into memory chips, module controller, or storage system controllers. Alternatively, the wear leveling algorithm can be implemented in higher level such as system software, MTD wear leveling module, PCM specific Translation Layer or dedicated PCM file systems, where more memory and resources are available.

The characteristic of a selected memory cell is sensed by the sensing unit 13 after the pulse generator 17 applies the testing pulse to the selected memory cell. The characteristic of the selected memory cell represents aging degree of the selected memory cell. In addition, the characteristic of the selected memory cell deviates when the selected memory cell is dying. Then, whether the characteristic of the selected memory cell deviates is determined by the controller 15.

Instead of treating all memory cells equally, the inspection approach precisely retrieves the characteristic deviation of the memory cells and facilitates upper management of the memory device, e.g. wear leveling algorithm. Unlike the conventional wear leveling algorithms, the wear leveling algorithm based on the scenario of the present invention does not set the same specific threshold of programming cycle count for all memory cells and solves the dilemma. Varied from the actual health status of the memory cell, the wear leveling algorithm accordingly provides appropriate arrangement to the memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory device, comprising:
    a memory cell array having a plurality of memory cells;
    a sensing unit, electrically connected to the memory cell array, for sensing a characteristic of a memory cell among the plurality of memory cells;
    a controller, electrically connected to the sensing unit, for determining whether the characteristic of the memory cell deviates and accordingly controlling the memory cell array; and
    a pulse generator, electrically connected to the memory cell array, for applying at least one testing pulse to the memory cell before the sensing unit senses the characteristic of the memory cell, wherein
    when the at least one testing pulse is applied to the memory cell during a reset operation, a duration of the at least one testing pulse is shorter than that of a reset pulse, and an amplitude of the at least one testing pulse is smaller than that of the reset pulse.

2. The memory device as claimed in claim 1, wherein the at least one testing pulse is in a form of a current, a voltage or a heat.

3. The memory device as claimed in claim 1, wherein the at least one testing pulse is generated in a pre-programming stage or in a programming stage.

4. The memory device as claimed in claim 1, wherein a storage state of one of the plurality of memory cells remains after the at least one testing pulse is applied.

5. The memory device as claimed in claim 1, wherein the characteristic is a resistance, a program pulse duration, an amplitude of a programming voltage, a current of a programming current, or a number of steps of an incremental-step-pulse programming (hereinafter, ISPP) process of the memory cell.

6. The memory device as claimed in claim 1, wherein the characteristic of the memory cell represents an aging degree of the memory cell, and the characteristic of the memory cell deviates when the memory cell is dying.

7. The memory device as claimed in claim 6, wherein when the memory cell is risky, the controller stops accessing the memory cell.

8. The memory device as claimed in claim 1, wherein the sensing unit senses the characteristic of the memory cell through a read pulse.

9. The memory device as claimed in claim 1, wherein the controller manages the memory cell array according to a wear leveling algorithm based on characteristics of the plurality of memory cells.

10. A controlling method applied to a memory cell array comprising a plurality of memory cells, the controlling method comprising steps of:
    applying at least one testing pulse to a memory cell among the plurality of memory cells, wherein when the at least one testing pulse is applied to the memory cell during a reset operation, a duration of the at least one testing pulse is shorter than that of a reset pulse, and an amplitude of the at least one testing pulse is smaller than that of the reset pulse;

sensing a characteristic of the memory cell;
determining whether the characteristic of the memory cell deviates; and
controlling the memory cell array in response to whether the characteristic of the memory cell deviates.

11. The controlling method as claimed in claim 10, wherein the at least one testing pulse is in a form of a current, a voltage or a heat, and a storage state of the memory cell remains after the at least one testing pulse is applied.

12. The controlling method as claimed in claim 10, wherein the at least one testing pulse is generated in a pre-programming stage or in a programming stage.

13. The controlling method as claimed in claim 10, wherein the step of controlling the memory cell array represents that managing the memory cell array according to a wear leveling algorithm based on characteristics of the plurality of memory cells.

14. A memory device, comprising:
a memory cell array having a plurality of memory cells;
a sensing unit, electrically connected to the memory cell array, for sensing a characteristic of a memory cell among the plurality of memory cells;
a controller, electrically connected to the sensing unit, for determining whether the characteristic of the memory cell deviates and accordingly controlling the memory cell array; and
a pulse generator, electrically connected to the memory cell array, for applying at least one testing pulse to the memory cell before the sensing unit senses the characteristic of the memory cell, wherein when the at least one testing pulse is applied to the memory cell during a set operation, a duration of the at least one testing pulse is shorter than that of a set pulse, and an amplitude of the at least one testing pulse is smaller than that of the set pulse.

15. The memory device as claimed in claim 14, wherein the at least one testing pulse is in a form of a current, a voltage or a heat.

16. The memory device as claimed in claim 14, wherein the at least one testing pulse is generated in a pre-programming stage or in a programming stage.

17. The memory device as claimed in claim 14, wherein a storage state of one of the plurality of memory cells remains after the at least one testing pulse is applied.

18. A controlling method applied to a memory cell array comprising a plurality of memory cells, the controlling method comprising steps of:
applying at least one testing pulse to a memory cell among the plurality of memory cells, wherein when the at least one testing pulse is applied to the memory cell during a set operation, a duration of the at least one testing pulse is shorter than that of a set pulse, and an amplitude of the at least one testing pulse is smaller than that of the set pulse;
sensing a characteristic of the memory cell;
determining whether the characteristic of the memory cell deviates; and
controlling the memory cell array in response to whether the characteristic of the memory cell deviates.

19. The controlling method as claimed in claim 18, wherein the at least one testing pulse is in a form of a current, a voltage or a heat, and a storage state of the memory cell remains after the at least one testing pulse is applied.

20. The controlling method as claimed in claim 18, wherein the at least one testing pulse is generated in a pre-programming stage or in a programming stage.

* * * * *